(12) United States Patent
Xiang

(10) Patent No.: US 12,185,579 B2
(45) Date of Patent: Dec. 31, 2024

(54) ORGANIC LIGHT EMITTING DIODE AND MANUFACTURING METHOD THEREOF, AND DISPLAY PANEL

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Yepeng Xiang, Wuhan (CN)

(73) Assignees: Wuhan China Star Optoelectronics Technology Co., Ltd., Hubei (CN); Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/608,142

(22) PCT Filed: Jul. 21, 2021

(86) PCT No.: PCT/CN2021/107542
§ 371 (c)(1),
(2) Date: Nov. 1, 2021

(87) PCT Pub. No.: WO2023/272815
PCT Pub. Date: Jan. 5, 2023

(65) Prior Publication Data
US 2024/0023370 A1  Jan. 18, 2024

(30) Foreign Application Priority Data
Jun. 28, 2021 (CN) .......................... 202110717851.8

(51) Int. Cl.
*H10K 59/12* (2023.01)
*H10K 50/12* (2023.01)
*H10K 50/155* (2023.01)
*H10K 50/16* (2023.01)
*H10K 59/80* (2023.01)
(Continued)

(52) U.S. Cl.
CPC ......... *H10K 59/1201* (2023.02); *H10K 50/12* (2023.02); *H10K 50/155* (2023.02);
(Continued)

(58) Field of Classification Search
CPC .. H10K 59/1201; H10K 50/12; H10K 50/155; H10K 50/16; H10K 59/80516;
(Continued)

(56) References Cited

U.S. PATENT DOCUMENTS

2011/0168987 A1   7/2011  Grizzi et al.
2023/0292607 A1*  9/2023  Ito ........................ C07D 405/14

FOREIGN PATENT DOCUMENTS

CN    101373817 A    2/2009
CN    105514290 A    4/2016
(Continued)

OTHER PUBLICATIONS

International Search Report in International application No. PCT/CN2021/107542, mailed on Mar. 28, 2022.
(Continued)

*Primary Examiner* — Mohammad A Rahman
(74) *Attorney, Agent, or Firm* — PV IP PC; Wei Te Chung

(57) ABSTRACT

An organic light emitting diode and a manufacturing method thereof, and a display panel are provided. The organic light emitting diode includes an anode layer, a hole transport layer, and a hole injection layer located between the anode layer and the hole transport layer. The hole injection layer has a work function of which a value increases in a direction from the anode layer toward the hole transport layer, and thus, an injection barrier between the anode layer and the hole transport layer is reduced and thereby improving the luminescent efficiency of the organic light emitting diode.

17 Claims, 2 Drawing Sheets

(51) Int. Cl.
  *H10K 71/30* (2023.01)
  *H10K 85/60* (2023.01)
  *H10K 102/00* (2023.01)
(52) U.S. Cl.
  CPC ....... *H10K 50/16* (2023.02); *H10K 59/80516* (2023.02); *H10K 59/8052* (2023.02); *H10K 71/30* (2023.02); *H10K 85/631* (2023.02); *H10K 85/654* (2023.02); *H10K 85/6572* (2023.02); *H10K 2102/302* (2023.02)
(58) Field of Classification Search
  CPC .. H10K 59/8052; H10K 71/30; H10K 85/631; H10K 85/654; H10K 85/6572; H10K 2102/302; H10K 2101/30; H10K 2101/40; H10K 2101/80; H10K 50/17; H10K 59/12; H10K 71/00; H10K 71/12; H10K 85/111; Y02E 10/549
  See application file for complete search history.

(56) References Cited

FOREIGN PATENT DOCUMENTS

| | | | |
|---|---|---|---|
| CN | 106025093 A | * | 10/2016 |
| CN | 112331788 A | | 2/2021 |
| KR | 20090113197 A | | 10/2009 |
| WO | 2013000162 A1 | | 1/2013 |

OTHER PUBLICATIONS

Written Opinion of the International Search Authority in International application No. PCT/CN2021/107542, mailed on Mar. 28, 2022.

Chinese Office Action for Invention issued in corresponding Chinese Patent Application No. 202110717851.8 dated Jun. 24, 2022, pp. 1-7.

* cited by examiner

ORGANIC LIGHT EMITTING DIODE AND MANUFACTURING METHOD THEREOF, AND DISPLAY PANEL

FIELD OF INVENTION

The present invention relates to display technologies, and more particularly, to an organic light emitting diode and a manufacturing method thereof, and a display panel.

BACKGROUND OF INVENTION

An organic light emitting diode (OLED) is an optoelectronic technique that realizes colorful displaying by means of an organic semiconductor material that generates reversible color change as being driven by an electrical current. The OLED possesses various advantages, such as being light and thin, high brightness, active light emitting, low energy consumption, wide viewing range, fast response, flexible, and wide range of operation temperature, and is regarded as the most promising new-generation display technique.

A known OLED device has a structure that includes a hole injection layer primarily implemented by means of co-evaporation of a p-dopant material and a hole transport layer material. However, the known way of manufacturing p-dopant material is complicated and costly, and the system range of stable and high-efficiency p-dopant materials is relatively small.

SUMMARY OF INVENTION

An organic light emitting diode that is made of conventional p-dopant materials suffers a technical issue of low luminescent efficiency is provided.

An embodiment of the application provides an organic light emitting diode, which comprises an anode layer, a hole transport layer, and a hole injection layer located between the anode layer and the hole transport layer;

wherein the hole injection layer has a work function of which a value increases in a direction from the anode layer toward the hole transport layer.

In the organic light emitting diode provided in the embodiment of the application, the hole injection layer comprises a polymer host and an additive doped in the polymer host;

wherein the additive has a surface energy that is lower than a surface energy of the polymer host, and the additive has an ionization potential that is higher than an ionization potential of the polymer host.

In the organic light emitting diode provided in the embodiment of the application, the additive comprises one of polystyrene sulfonic acid, a polystyrene sulfonic acid derivative, or an inorganic metal salt containing chlorine, and the polymer host comprises an aqueous solution of mixture of poly(3,4-ethylenedioxythiophene) and polystyrene sulfonate.

In the organic light emitting diode provided in the embodiment of the application, the hole injection layer has a thickness greater than 0 and less than or equal to 50 nm.

In the organic light emitting diode provided in the embodiment of the application, the value of the work function of the hole injection layer ranges from 4.8 eV to 5.95 eV.

In the organic light emitting diode provided in the embodiment of the application, the organic light emitting diode further comprises a light emitting layer, an electron transport layer, and a cathode layer;

wherein the light emission layer is arranged on a surface of the hole transport layer that is distant from the hole injection layer; the electron transport layer is arranged on a surface of the light emitting layer that is distant from the hole transport layer; and the cathode layer is arranged on a surface of the electron transport layer that is distant from the light emitting layer.

In the organic light emitting diode provided in the embodiment of the application, a material of the anode layer is indium tin oxide; a material of the hole transport layer is 4,4',4"-tris(carbazol-9-yl)-triphenylamine; the light emitting layer comprises a host-guest dopant material; a material of the electron transport layer is 1,3,5-tri(3-(3-pyridyl)phenyl)benzene; and a materiel of the cathode layer is lithium/aluminum fluoride.

Correspondingly, an embodiment of the application also provides a display panel, comprising an organic light emitting diode, the organic light emitting diode comprising an anode layer, a hole transport layer, and a hole injection layer located between the anode layer and the hole transport layer;

wherein the hole injection layer has a work function of which a value increases in a direction from the anode layer toward the hole transport layer.

In the organic light emitting diode provided in the embodiment of the application, the hole injection layer comprises a polymer host and an additive doped in the polymer host;

wherein the additive has a surface energy that is lower than a surface energy of the polymer host, and the additive has an ionization potential that is higher than an ionization potential of the polymer host.

In the organic light emitting diode provided in the embodiment of the application, the additive comprises one of polystyrene sulfonic acid, a polystyrene sulfonic acid derivative, or an inorganic metal salt containing chlorine, and the polymer host comprises an aqueous solution of mixture of poly(3,4-ethylenedioxythiophene) and polystyrene sulfonate.

In the organic light emitting diode provided in the embodiment of the application, the hole injection layer has a thickness greater than 0 and less than or equal to 50 nm.

In the organic light emitting diode provided in the embodiment of the application, the value of the work function of the hole injection layer ranges from 4.8 eV to 5.95 eV.

In the organic light emitting diode provided in the embodiment of the application, the organic light emitting diode further comprises a light emitting layer arranged on a surface of the hole transport layer that is distant from the hole injection layer, an electron transport layer arranged on a surface of the light emitting layer that is distant from the hole transport layer, and a cathode layer arranged on a surface of the electron transport layer that is distant from the light emitting layer;

wherein a material of the anode layer is indium tin oxide; a material of the hole transport layer is 4,4',4"-tris(carbazol-9-yl)-triphenylamine; the light emitting layer comprises a host-guest dopant material; a material of the electron transport layer is 1,3,5-tri(3-(3-pyridyl)phenyl)benzene, and a materiel of the cathode layer is lithium/aluminum fluoride.

Correspondingly, an embodiment of the application further provides an organic light emitting diode manufacturing method, comprising: forming a hole injection layer on an anode layer; forming a hole transport layer on the hole injection layer; forming a light emission layer on the hole transport layer; forming an electron transport layer on the light emitting layer; and forming a cathode layer on the electron transport layer;

wherein the step of forming the hole injection layer comprises:

providing a polymer host, the polymer host being an aqueous solution formed of a polymer;

doping an additive in the polymer host to form a first solution; and subjecting the first solution to baking to form the hole injection layer.

In the organic light emitting diode manufacturing method provided in the embodiment of the present invention, the additive has a surface energy that is lower than a surface energy of the polymer host, and the additive has an ionization potential that is higher than an ionization potential of the polymer host.

In the organic light emitting diode manufacturing method provided in the embodiment of the present invention, the additive comprises one of polystyrene sulfonic acid, a polystyrene sulfonic acid derivative, or an inorganic metal salt containing chlorine, and the polymer host comprises an aqueous solution of mixture of poly(3,4-ethylenedioxythiophene) and polystyrene sulfonate.

In the organic light emitting diode manufacturing method provided in the embodiment of the present invention, subjecting the first solution to baking to form the hole injection layer further comprises:

baking the first solution in an atmospheric environment at a temperature ranges from 175° C. to 185° C. for a baking time of 15 minutes to 25 minutes to finally form the hole injection layer.

In the organic light emitting diode manufacturing method provided in the embodiment of the present invention, the hole injection layer has a work function of which a value increases in a direction from the anode layer toward the hole transport layer.

In the organic light emitting diode manufacturing method provided in the embodiment of the present invention, the hole injection layer has a thickness greater than 0 and less than or equal to 50 nm; and the value of the work function of the hole injection layer ranges from 4.8 eV to 5.95 eV.

In the organic light emitting diode manufacturing method provided in the embodiment of the present invention, a material of the anode layer is indium tin oxide; a material of the hole transport layer is 4,4',4"-tris(carbazol-9-yl)-triphenylamine; the light emission layer comprises a host-guest dopant material; a material of the electron transport layer is 1,3,5-tri(3-(3-pyridyl)phenyl)benzene, and a materiel of the cathode layer is lithium/aluminum fluoride.

The beneficial effect of the present disclosure is that: the embodiments of the application provide an organic light emitting diode and a manufacturing method thereof, and a display panel. The organic light emitting diode is formed by mixing a polymer host material formed of an aqueous solution of poly(3,4-ethylenedioxythiophene):polystyrene sulfonate (PEDOTPSS) and an additive material formed of polystyrene sulfonic acid and derivates thereof, or an inorganic metal salt containing chlorine and subjected to wet processing to form a material of the hole injection layer, wherein the surface energy of the additive is lower than the surface energy of the polymer host and the ionization potential of the additive is higher than the ionization potential of the polymer host, such that the value of the work function of the hole injection layer increases in a direction from one side of the hole injection layer that is adjacent to the anode layer toward one side of the hole injection layer that is adjacent to the hole transport layer, so as to serve as a replacement for using a p-type dopant material to manufacture the hole injection layer, and reduce the manufacturing cost of the hole injection layer; also, an injection barrier between the anode layer to the hole transport layer is reduced to allow holes to be injected in a more efficient way and enhance the capability of hole injection; and further, holes accumulating at the interfaces of the hole injection layer can be reduced to reduce recombination of extra electrons and excitons to maintain balance between electrons and holes and greatly improve the luminescent efficiency and lifespan of the organic light emitting diode and lower the driving operation voltage.

DETAILED DESCRIPTION OF PREFERRED EMBODIMENTS

Embodiments of the application are made in view of the technical problem that the known way of manufacturing an organic light emitting diode with a p-type dopant material has a low efficiency, and the embodiments of the application alleviate the above deficiency.

As shown in FIGS. 1-4, an embodiment of the application provides an organic light emitting diode 100, which comprises an anode layer 101, a hole transport layer 103, and a hole injection layer 102 located between the anode layer 101 and the hole injection layer 103.

In the diode, the hole injection layer 102 has a work function of which a value increases in a direction from the anode layer 101 toward the hole transport layer 103.

An embodiment of the application provides an organic light emitting diode 100, and the organic light emitting diode 100 is formed by having a polymer host material and an additive material mixed and subjected to wet processing to form a material of a hole injection layer, wherein a surface energy of the additive is lower than a surface energy of the polymer host and an ionization potential of the additive is higher than an ionization potential of the polymer host, such that a value of a work function of the hole injection layer 102 increases from one side of the hole injection layer 102 that is adjacent to the anode layer 101 toward one side of the hole injection layer 102 that is adjacent to the hole transport layer 103, so as to serve as a replacement for using a p-type dopant material to manufacture the hole injection layer 102, and reduce the manufacturing cost of the hole injection layer 102; also, an injection barrier between the anode layer 101 to the hole transport layer 103 is reduced to allow holes to be injected in a more efficient way and enhance the capability of hole injection; and further, holes accumulating at the interfaces of the hole injection layer 102 can be reduced to reduce recombination of extra electrons and excitons to maintain balance between electrons and holes and greatly improve the luminescent efficiency and lifespan of the organic light emitting diode and lower the driving operation voltage.

A description will be made to the technical solution of the application with reference to embodiments.

Embodiment 1

Figure 1:
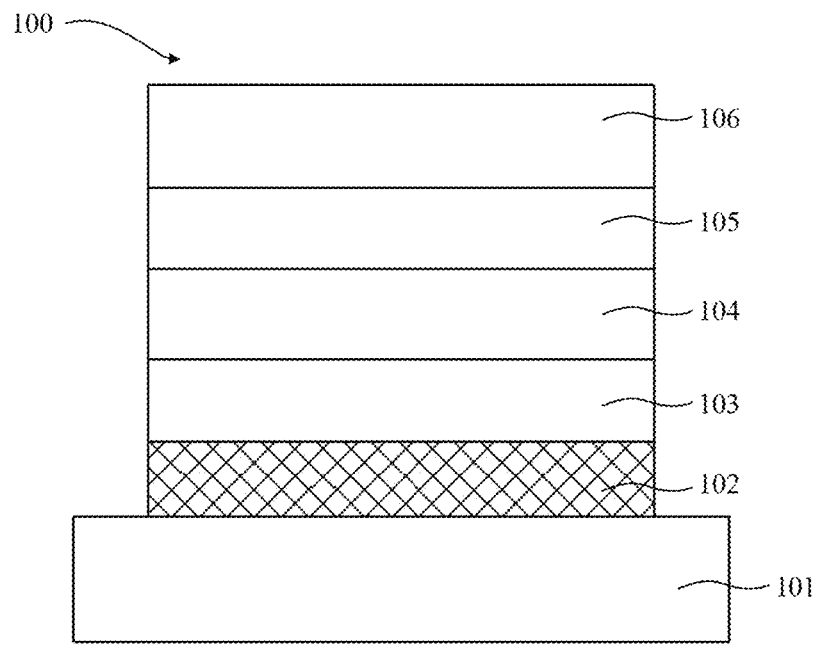
FIG. 1 is a cross-sectional view showing an organic light emitting diode provided according to a first embodiment of the application.

As shown in FIG. 1, the instant embodiment provides an organic light emitting diode 100. The organic light emitting diode 100 is a top-emission organic light emitting diode. The organic light emitting diode 100 comprises: an anode layer 101, a hole injection layer 102, a hole transport layer 103, a light emitting layer 104, an electron transport layer 105, and a cathode layer 106.

In the diode, the hole injection layer 102 is arranged on a surface of the anode layer 101, and the hole injection layer 102 functions to inject holes from the cathode into the OLED device; the hole transport layer 103 is arranged on a surface of a side of the hole injection layer 102 that is away from the anode layer 101, and the hole transport layer 103 functions to transports the holes that are injected from the hole injection layer 102 into the OLED to the light emitting layer 104; the light emitting layer 104 is arranged on a surface of a side of the hole transport layer 103 that is away from the hole injection layer 102, and holes and electrons recombine with each other in the light emitting layer 104 to transfer energy to the light emission material in order to excite the light emission material to an excited state, and the light emission material, when returning from the excited state back to a ground state, gives off light by means of radiative transition; the electron transport layer 105 is arranged on a surface of a side of the light emission layer 104 that is away from the hole transport layer 103, and the electron transport layer 105 functions to transport electrons that are injected from the electron injection layer into the OLED to the light emitting layer 104; the cathode layer 106 is arranged on a surface of the electron transport layer 105 that is away from the light emitting layer 104, and the cathode layer 106 functions to inject electrons and serves as a total reflection cathode.

In an embodiment of the application, the anode layer 101 can be a transparent or non-transparent electrode, including, but not limited to, a metal or metal oxide, and the anode layer 101 is preferably formed by coating a layer of electrically conductive indium tin oxide on a glass substrate; the hole transport layer 103 includes, but not limited to, an organic small-molecule material, and the hole transport layer 103 preferably comprises 4,4',4''-tris(carbazol-9-yl)-triphenylamine (TCTA); the light emission layer 104 includes, but not limited to, a host-guest dopant material system, and a material of the light emission layer 104 is preferably bis[2-((oxo)diphenylphosphino)phenyl]ether (DPEPO):bis[4-(9,9-dimethyl-9,10-dihydroacridine)phenyl]solfone (DMAC-DPS); the electron transport layer 105 includes, but not limited to, an organic small-molecule material, and a material of the electron transport layer 105 is preferably 1,3,5-tri(3-(3-pyridyl)phenyl)benzene (Tm3PyPB); the cathode layer 106 can be a transparent or non-transparent metallic electrode or can be a metal alloy electrode, the cathode layer 106 having a thickness that is not greater than 100 nm, a material of the cathode layer 106 is preferably lithium/aluminum fluoride.

In an embodiment of the application, the organic light emitting diode 100 further comprises an electron blocking layer, the electron blocking layer being arranged between the hole transport layer 103 and the light emission layer 104, the electron blocking layer including, but not limited to, an electron blocking material and an exciton blocking material; the organic light emitting diode 100 further comprises a hole blocking layer, the hole blocking layer being arranged between the light emission layer 104 and the electron transport layer 105, the hole blocking layer including, but not limited to, an organic small-molecule material such as a hole blocking material and an exciton blocking material; the organic light emitting diode 100 further comprises an electron injection layer, the electron injection layer being arranged between the electron transport layer 105 and the cathode layer 106, the electron injection layer including, but not limited to, an organic small-molecule material.

In an embodiment of the application, the hole injection layer 102 has a work function of which a value increases in a direction from the anode layer to the hole transport layer.

Specifically, the hole injection layer 102 comprises a polymer host and an additive doped in the polymer host, wherein the additive has a surface energy that is lower than a surface energy of the polymer host, and an ionization potential of the additive is higher than an ionization potential of the polymer host.

In an embodiment of the application, the additive includes any one of polystyrene sulfonic acid, a polystyrene sulfonic acid derivative, or an inorganic metal salt containing chlorine, and the polymer host includes an aqueous solution of a mixture of poly(3,4-ethylenedioxythiophene) and polystyrene sulfonate (PEDOIPSS), PEDOIPSS being generally a deep blue liquid and having a solid content after being dissolved in a range of 1.3-1.7%, parameters being slightly different in different applications. In the above, a molecule structure formula of poly(3,4-ethylenedioxythiophene) and polystyrene sulfonate (PEDOIPSS) is as follows:

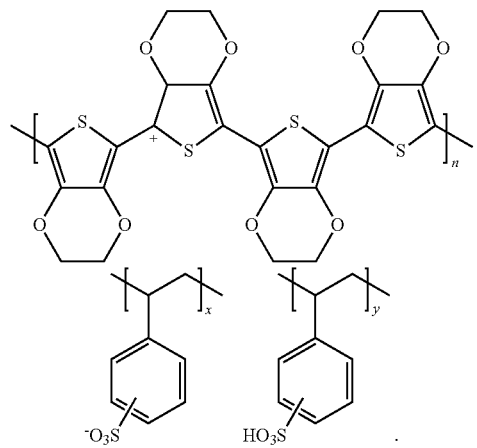

In an embodiment of the application, the hole injection layer 102 has a thickness that is greater than 0 and less than or equal to 50 nm, wherein if the thickness of the hole injection layer is greater than 50 nm, an energy barrier between the hole injection layer 102 and the hole transport layer 103 is increased.

In an embodiment of the application, a value range of the work function of the hole injection layer 102 is from 4.8 eV to 5.95 eV. Thus, the work function of the hole injection layer 102 at one side thereof that is adjacent to the anode layer 101 is close to a work function of the anode layer, and the work function of the hole injection layer 102 at one side thereof that is adjacent to the hole transport layer 103 is close to the work function of the hole transport layer 103. This arrangement helps reduce the energy barrier between the hole injection layer 102 and the hole transport layer 103.

In view of the problem of low efficiency of the conventional art in manufacturing an organic light emitting diode with a p-type dopant material, the embodiment of the application provides a top-emission organic light emitting diode, in which the organic light emitting diode is formed by mixing a polymer host material formed of an aqueous solution of poly(3,4-ethylenedioxythiophene):polystyrene sulfonate (PEDOT.PSS) and an additive material formed of polystyrene sulfonic acid and derivates thereof, or an inorganic metal salt containing chlorine and subjected to wet processing to form a material of the hole injection layer 102, wherein the surface energy of the additive is lower than the surface energy of the polymer host and the ionization potential of the additive is higher than the ionization potential of the polymer host, such that the value of the work function of the hole injection layer 102 increases in a direction from one side of the hole injection layer 102 that is adjacent to the anode layer 101 toward one side of the hole injection layer 102 that is adjacent to the hole transport layer 103, so as to serve as a replacement for using a p-type dopant material to manufacture the hole injection layer 102, and reduce the manufacturing cost of the hole injection layer 102; also, an injection barrier between the anode layer 101 to the hole transport layer 103 is reduced to allow holes to be injected in a more efficient way and enhance the capability of hole injection; and further, holes accumulating at the interfaces of the hole injection layer 102 can be reduced to reduce recombination of extra electrons and excitons to maintain balance between electrons and holes and greatly improve the luminescent efficiency and lifespan of the organic light emitting diode and lower the driving operation voltage.

Embodiment 2

Figure 2:
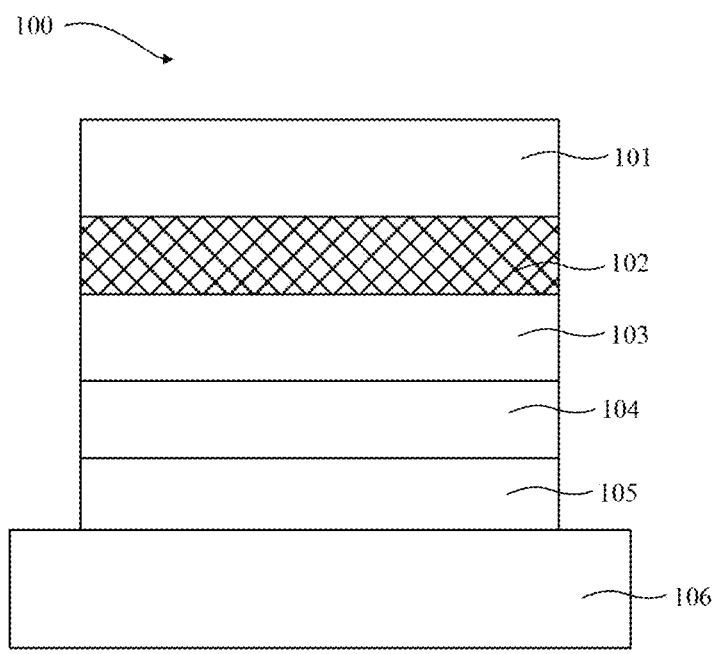
FIG. 2 is a cross-sectional view showing an organic light emitting diode provided according to a second embodiment of the application.

As shown in FIG. 2, the instant embodiment also provides an organic light emitting diode 100. The second embodiment of the application is different from the first embodiment of the application only in that the organic light emitting diode 100 is a bottom-emission organic light emitting diode, wherein the organic light emitting diode 100 comprises, sequentially stacked from bottom to top, a cathode layer 106, an electron transport layer 105, a light emitting layer 104, a hole transport layer 103, a hole injection layer 102, and an anode layer 101.

In view of the problem of low efficiency of the prior art in manufacturing an organic light emitting diode with a p-type dopant material, the embodiment of the application provides a bottom-emission organic light emitting diode, in which the organic light emitting diode is formed by mixing a polymer host material formed of an aqueous solution of poly(3,4-ethylenedioxythiophene):polystyrene sulfonate (PEDOT.PSS) and an additive material formed of polystyrene sulfonic acid and derivates thereof, or an inorganic metal salt containing chlorine and subjected to wet processing to form a material of the hole injection layer 102, wherein the surface energy of the additive is lower than the surface energy of the polymer host and the ionization potential of the additive is higher than the ionization potential of the polymer host, such that the value of the work function of the hole injection layer 102 increases in a direction from one side of the hole injection layer 102 that is adjacent to the anode layer 101 toward one side of the hole injection layer 102 that is adjacent to the hole transport layer 103, so as to serve as a replacement for using a p-type dopant material to manufacture the hole injection layer 102, and reduce the manufacturing cost of the hole injection layer 102; also, an injection barrier between the anode layer 101 to the hole transport layer 103 is reduced to allow holes to be injected in a more efficient way and enhance the capability of hole injection; and further, holes accumulating at the interfaces of the hole injection layer 102 can be reduced to reduce recombination of extra electrons and excitons to maintain balance between electrons and holes and greatly improve the luminescent efficiency and lifespan of the organic light emitting diode and lower the driving operation voltage.

An embodiment of the application also provides a manufacturing method for an organic light emitting diode 100 as described above, comprising forming a hole injection layer 102 on an anode layer 101; forming a hole transport layer 103 on the hole injection layer 102; forming a light emitting layer 104 on the hole transport layer 103; forming an electron transport layer 105 on the light emitting layer 104; and, forming a cathode layer 106 on the electron transport layer 105;
wherein the step of forming the hole injection layer 102 comprises:
first providing a polymer host, the polymer host being an aqueous solution formed of a polymer; then doping an additive in the polymer host to form a first solution; and then, subjecting the first solution to baking to form the hole injection layer 102.

In an embodiment of the application, a mass percentage of the polymer host in the first solution is 1%-5%, and a mass percentage of the additive in the first solution is 0.1%-5%, wherein the additive is any one of polystyrene sulfonic acid, a polystyrene sulfonic acid derivative, or an inorganic metal salt containing chlorine, and the polymer host is an aqueous solution of mixture of poly(3,4-ethylenedioxythiophene) and polystyrene sulfonate (PEDOT.PSS).

In an embodiment of the application, subjecting the first solution to baking to form the hole injection layer further comprises: baking the first solution in an atmospheric environment at a temperature of 175° C. to 185° C. for a baking time of 15 to 25 minutes to finally form the hole injection layer.

In an embodiment of the application, other films of the organic light emitting diode 100 can be made according to any known ways of the technical field to which the application is related, such as reference to a manufacturing method disclosed in document "Adv.Mater.2003, 15, 277". A specific process is: forming the hole injection layer 102 provided in an embodiment of the application on an electrically conductive glass (ITO) backing that has been cleaned in a condition of high level of vacuum, and sequentially applying vapor deposition, in a condition of high level of vacuum, to form the hole transport layer 103, the light emitting layer 104, the electron transport layer 105, and the cathode layer 106.

In the manufacturing method for an organic light emitting diode as provided in an embodiment of the application, an additive that has a surface energy higher than a surface energy of the polymer host solution and an ionization potential higher than an ionization potential of the polymer host solution is doped in the polymer host that forms the hole injection layer 102, and the polymer host solution and the additive can self-assemble, making the work function of the hole injection layer 102 gradually increasing and reducing the injection barrier between the anode layer 101 and the hole transport layer 103. The so-called "self-assembly" refers to a technique in which basic structural units (molecules, nano substance, micrometer or larger-scale substances) autonomously form an ordered structure. During a self-assembling process, the basic structural units, based on interaction of non-covalent bonds, autonomously organize or aggregate to form a structure that is stable and has a specific regular geometric shape. By reducing the injection barrier between the anode layer 101 and the hole transport layer 103, injection of holes is made more efficient and capability of hole injection is enhanced.

In the above embodiment of the application, a material of the hole injection layer is formed of a polymer host material formed of an aqueous solution of poly(3,4-ethylenedioxythiophene): polystyrene sulfonate (PEDOT:PSS) and poly(4-chlorostyrene sulfonic acid), for making an organic light emitting diode A1. Also, 1,4,5,8,9,11-hexaazatriphenylene-hexacarbonitrile is selected as a material for the hole injection layer, for making an organic light emitting diode A2. The organic light emitting diode A2 is provided as a comparative example for the organic light emitting diode A1, wherein both the organic light emitting diode A1 and the organic light emitting diode A2 are of a top-emission structure and a molecule structural formula of poly(4-chlorostyrene sulfonic acid) is as follows:

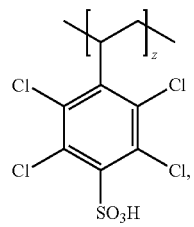

where z is a positive integer that is greater than 1.

Specifically, the structures of the organic light emitting diode A1 and the organic light emitting diode A2 are such that the structures of the anode layer 101 to the cathode layer 106 are provided sequentially below:

Organic light emitting diode A1: the anode layer 101 being ITO; the hole transport layer 103 being 4,4',4''-tris(carbazol-9-yl)-triphenylamine having a thickness of 35 nm; the light emission layer 104 being DPEPO:DMAC-DPS (10%, 20 nm); the electron transport layer being 1,3,5-tri(3-(3-pyridyl)phenyl)benzene having a thickness of 40 nm; the cathode layer 106 being LiF having a thickness of 1 nm, combined with A1 of 100 nm thickness to form a composite layer;
  wherein the hole injection layer 102 is other organic small-molecule materials having a thickness of 5 nm, such as 1,4,5,8,9,11-hexaazatriphenylenehexacarbonitrile.

Organic light emitting diode A2: the anode layer 101 being ITO; the hole transport layer 103 being 4,4',4''-tris(carbazol-9-yl)-triphenylamine having a thickness of 35 nm; the light emission layer 104 being DPEPODMAC-DPS (10%, 20 nm); the electron transport layer being 1,3,5-tri(3-(3-pyridyl)phenyl)benzene having a thickness of 40 nm; the cathode layer 106 being LiF having a thickness of 1 nm, combined with A1 of 100 nm to form a composite layer;
  wherein the hole injection layer 102 is a material formed of a PEDOT PSS aqueous solution and poly(4-chlorostyrene sulfonic acid) having a thickness of 5 nm.

Figure 3:
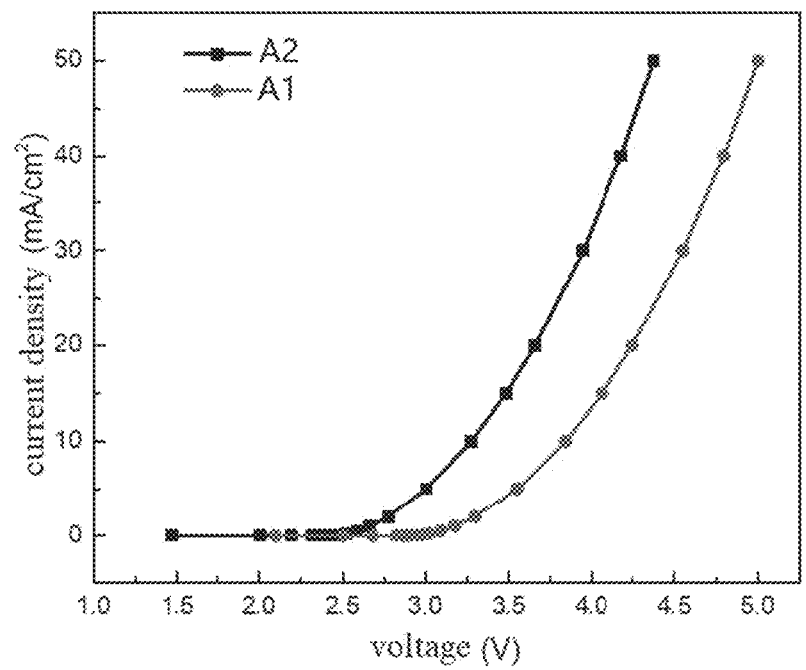
FIG. 3 is a plot showing a relationship curve between voltage and current density of the organic light emitting diode provided according to the embodiment of the application.

As shown in FIG. 3, which is a plot showing a relationship curve between voltage and current density for an organic light emitting diode provided in an embodiment of the application; it is appreciated from FIG. 3 that after the voltage of the organic light emitting diode becomes greater than 2.5V, with a continuous increase of the voltage (unit: V), the current density (unit: mA/cm 2) of the organic light emitting diode gets continuously increased. Also, under the condition of identical voltage, the current density of the organic light emitting diode A2 is greater than the current density of the organic light emitting diode A1. Thus, under the condition of identical voltage for light emission, using the material of hole injection layer as provided in the embodiments of the application demonstrates a higher current density than an organic light emitting diode that is formed of a hole injection layer material made of other materials.

Figure 4:
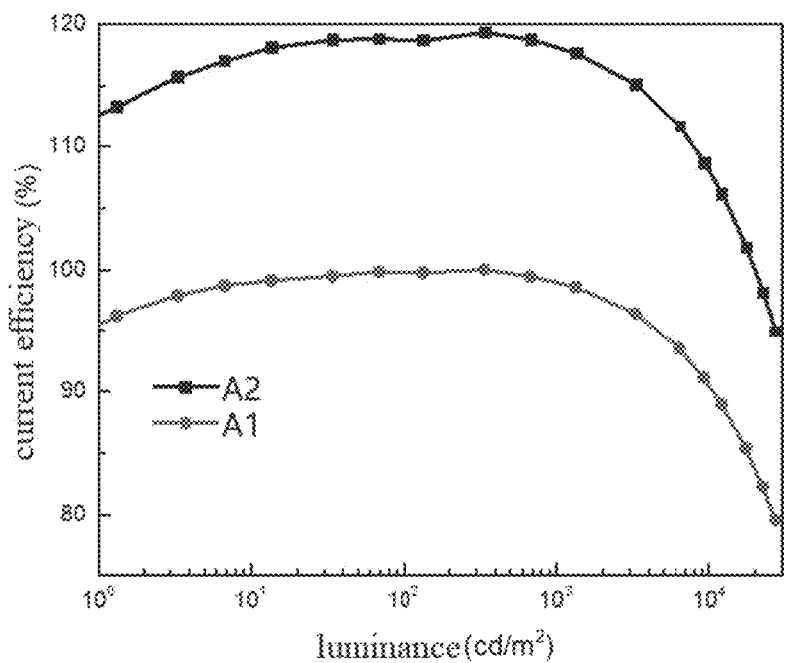
FIG. 4 is a plot showing a relationship curve between luminance and current efficiency of the organic light emitting diode provided according to the embodiment of the application.

As shown in FIG. 4, which is a plot showing a relationship curve between luminance and current efficiency for an organic light emitting diode provided in an embodiment of the application, it is appreciated from FIG. 4 that when the luminance of the organic light emitting diode becomes less than or equal to 300 cd/m$^2$, the current efficiency (unit: %) of the organic light emitting diode increases with an increase of the luminance (unit: cd/m$^2$) of the organic light emitting diode; when the luminance of the organic light emitting diode becomes greater than 300 cd/m$^2$, the current efficiency of the organic light emitting diode decreases with an increase of the luminance of the organic light emitting diode; for this, under the condition of identical level of luminance, the current efficiency of the organic light emitting diode A2 is greater than the current efficiency of the organic light emitting diode A1. Thus, under the condition of identical luminance, using the material of hole injection layer as provided in the embodiments of the application demonstrates a higher current efficiency than an organic light emitting diode that is formed of a hole injection layer material made of other materials.

Correspondingly, an embodiment of the application also provides a display panel. The display panel comprises the organic light emitting diode 100 according to any item described above;
  wherein the display panel can be any product or device that includes a displaying function, such as an electronic paper, an OLED panel, a mobile phone, a tablet computer, a television, a display, a notebook computer, a digital picture frame, and a navigation device.

In summary, embodiments of the application provide an organic light emitting diode and a manufacturing method thereof, and a display panel. The organic light emitting diode is formed by mixing a polymer host material formed of an aqueous solution of poly(3,4-ethylenedioxythiophene):polystyrene sulfonate (PEDOT.PSS) and an additive material formed of polystyrene sulfonic acid and derivates thereof, or an inorganic metal salt containing chlorine and subjected to wet processing to form a material of the hole injection layer, wherein the surface energy of the additive is lower than the surface energy of the polymer host and the ionization potential of the additive is higher than the ionization potential of the polymer host, such that the value of the work function of the hole injection layer increases in a direction from one side of the hole injection layer that is adjacent to the anode layer toward one side of the hole injection layer that is adjacent to the hole transport layer, so as to serve as a replacement for using a p-type dopant material to manufacture the hole injection layer, and reduce the manufacturing cost of the hole injection layer; also, an injection barrier between the anode layer 101 to the hole transport layer 103 is reduced to allow holes to be injected in a more efficient way and enhance the capability of hole injection; and further, holes accumulating at the interfaces of the hole injection layer can be reduced to reduce recombination of extra electrons and excitons to maintain balance between electrons and holes and greatly improve the luminescent efficiency and lifespan of the organic light emitting diode and lower the driving operation voltage.

In the above embodiments, the descriptions made to the various embodiments may be individually focused on different parts, and as such, certain details that are missing in one embodiment may refer to related descriptions of other embodiments.

A detailed description has been provided above for an organic light emitting diode and a manufacturing method thereof, and a display panel provided in embodiments of the application. Specific examples are involved in the disclosure for expounding the principle of and the ways of embodying the application. The description provided above is only for helping understand the technical solution and the core idea of the application. Also, for those having ordinary skill in the art may appreciate, variations can be made on the embodiments and applications based on the thoughts of the application. In summary, the contents of the disclosure should not be construed as limiting to the application.

What is claimed is:

1. An organic light emitting diode, comprising
an anode layer, a hole transport layer, and a hole injection layer located between the anode layer and the hole transport layer;
wherein a work function of the hole injection layer has a value increases in a direction from the anode layer toward the hole transport layer;
wherein the organic light emitting diode further comprises a light emitting layer arranged on a surface of the hole transport layer away from the hole injection layer, an electron transport layer arranged on a surface of the light emitting layer away from the hole transport layer, and a cathode layer arranged on a surface of the electron transport layer away from the light emitting layer; and
wherein a material of the anode layer is indium tin oxide, a material of the hole transport layer is 4,4',4"-tris(carbazol-9-yl)-triphenylamine, the light emitting layer comprises a host dopant material and a guest dopant material, a material of the electron transport layer is 1,3,5-tri (3-(3-pyridyl)phenyl)benzene, and a materiel of the cathode layer is lithium/aluminum fluoride.

2. The organic light emitting diode according to claim 1, wherein
the hole injection layer comprises a polymer host and an additive doped in the polymer host; and
wherein a surface energy of the additive is lower than a surface energy of the polymer host, and an ionization potential of the additive is greater than an ionization potential of the polymer host.

3. The organic light emitting diode according to claim 2, wherein
the additive comprises one selected from a polystyrene sulfonic acid, a polystyrene sulfonic acid derivative, and an inorganic metal salt containing chlorine, and the polymer host comprises an aqueous solution of mixture of poly (3,4-ethylenedioxythiophene) and polystyrene sulfonate.

4. The organic light emitting diode according to claim 3, wherein
a thickness of the hole injection layer is greater than 0 and less than or equal to 50 nm.

5. The organic light emitting diode according to claim 1, wherein
the value of the work function of the hole injection layer ranges from 4.8 eV to 5.95 eV.

6. A display panel, comprising
an organic light emitting diode, wherein the organic light emitting diode comprises an anode layer, a hole transport layer, and a hole injection layer located between the anode layer and the hole transport layer; and
wherein a work function of the hole injection layer has a value increases in a direction from the anode layer toward the hole transport layer;
wherein the organic light emitting diode further comprises a light emitting layer arranged on a surface of the hole transport layer away from the hole injection layer, an electron transport layer arranged on a surface of the light emitting layer away from the hole transport layer, and a cathode layer arranged on a surface of the electron transport layer away from the light emitting layer; and
wherein a material of the anode layer is indium tin oxide, a material of the hole transport layer is 4,4',4"-tris(carbazol-9-yl)-triphenylamine, the light emitting layer comprises a host dopant material and a guest dopant material, a material of the electron transport layer is 1,3,5-tri (3-(3-pyridyl)phenyl)benzene, and a materiel of the cathode layer is lithium/aluminum fluoride.

7. The display panel according to claim 6, wherein
the hole injection layer comprises a polymer host and an additive doped in the polymer host; and
wherein a surface energy of the additive has is lower than a surface energy of the polymer host, and an ionization potential of the additive is greater than an ionization potential of the polymer host.

8. The display panel according to claim 6, wherein
the additive comprises one selected from a polystyrene sulfonic acid, a polystyrene sulfonic acid derivative, and an inorganic metal salt containing chlorine, and the polymer host comprises an aqueous solution of mixture of poly (3,4-ethylenedioxythiophene) and polystyrene sulfonate.

9. The display panel according to claim 6, wherein
a thickness of the hole injection layer is greater than 0 and less than or equal to 50 nm.

10. The display panel according to claim 6, wherein
the value of the work function of the hole injection layer ranges from 4.8 eV to 5.95 eV.

11. An organic light emitting diode manufacturing method, comprising:
forming a hole injection layer on an anode layer;
forming a hole transport layer on the hole injection layer;
forming a light emission layer on a surface of the hole transport layer away from the hole injection layer;
forming an electron transport layer on a surface of the light emitting layer away from the hole transport layer; and
forming a cathode layer on a surface of the electron transport layer away from the light emitting layer;

wherein the step of forming the hole injection layer comprises:
providing a polymer host, wherein the polymer host is an aqueous solution formed of a polymer;
doping an additive in the polymer host to form a first solution; and
baking the first solution to form the hole injection layer;
wherein a material of the anode layer is indium tin oxide, a material of the hole transport layer is 4,4',4"-tris (carbazol-9-yl)-triphenylamine, the light emitting layer comprises a host dopant material and a guest dopant material, a material of the electron transport layer is 1,3,5-tri (3-(3-pyridyl)phenyl)benzene, and a materiel of the cathode layer is lithium/aluminum fluoride.

12. The organic light emitting diode manufacturing method according to claim 11, wherein
a mass percentage of the polymer host in the first solution ranges from 1% to 5%, and a mass percentage of the additive in the first solution ranges from 0.1% to 5%.

13. The organic light emitting diode manufacturing method according to claim 12, wherein
a surface energy of the additive has is lower than a surface energy of the polymer host, and an ionization potential of the additive has is greater than an ionization potential of the polymer host.

14. The organic light emitting diode manufacturing method according to claim 13, wherein
the additive comprises one selected from a polystyrene sulfonic acid, a polystyrene sulfonic acid derivative, and an inorganic metal salt containing chlorine, and the polymer host comprises an aqueous solution of mixture of poly (3,4-ethylenedioxythiophene) and polystyrene sulfonate.

15. The organic light emitting diode manufacturing method according to claim 11, wherein
baking the first solution to form the hole injection layer further comprises:
baking the first solution in an atmospheric environment at a temperature ranging from 175° C. to 185° C. for a baking time of 15 minutes to 25 minutes to form the hole injection layer.

16. The organic light emitting diode manufacturing method according to claim 15, wherein
a work function of the hole injection layer has a value increases in a direction from the anode layer toward the hole transport layer.

17. The organic light emitting diode manufacturing method according to claim 16, wherein
a thickness of the hole injection layer is greater than 0 and less than or equal to and the value of the work function of the hole injection layer ranges from 4.8 eV to 5.95 eV.

* * * * *